United States Patent
Skotnicki et al.

(10) Patent No.: US 8,847,059 B2
(45) Date of Patent: Sep. 30, 2014

(54) PROCESS FOR GENERATING ELECTRICAL ENERGY IN A SEMICONDUCTOR DEVICE AND THE CORRESPONDING DEVICE

(75) Inventors: Thomas Skotnicki, Crolles-Montfort (FR); Stephane Monfray, Eybens (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 267 days.

(21) Appl. No.: 13/187,071

(22) Filed: Jul. 20, 2011

(65) Prior Publication Data

US 2012/0017962 A1  Jan. 26, 2012

(30) Foreign Application Priority Data

Jul. 22, 2010 (FR) ...................................... 10 55978

(51) Int. Cl.
| | |
|---|---|
| *H01L 35/28* | (2006.01) |
| *H01L 35/02* | (2006.01) |
| *H01L 21/329* | (2006.01) |
| *H01L 27/16* | (2006.01) |
| *H01L 35/32* | (2006.01) |
| *H01L 35/34* | (2006.01) |

(52) U.S. Cl.
CPC ............... *H01L 35/34* (2013.01); *H01L 27/16* (2013.01); *H01L 35/32* (2013.01)
USPC ...... 136/207; 136/205; 136/230; 257/E21.352

(58) Field of Classification Search
None
See application file for complete search history.

(56) References Cited

U.S. PATENT DOCUMENTS

| | | | | |
|---|---|---|---|---|
| 3,790,829 | A | * | 2/1974 | Roth .............................. 310/306 |
| 5,288,336 | A | * | 2/1994 | Strachan et al. .............. 136/200 |
| 5,921,087 | A | | 7/1999 | Bhatia et al. |
| 6,403,876 | B1 | * | 6/2002 | Ghoshal et al. ............... 136/205 |
| 6,548,750 | B1 | * | 4/2003 | Picone .......................... 136/203 |
| 2001/0001961 | A1 | * | 5/2001 | Hiraishi et al. ............... 136/201 |
| 2003/0042497 | A1 | * | 3/2003 | Span .............................. 257/121 |
| 2005/0155642 | A1 | * | 7/2005 | Chen ............................ 136/252 |
| 2005/0178423 | A1 | | 8/2005 | Ramanathan et al. |
| 2005/0236029 | A1 | * | 10/2005 | Dowling ........................ 136/205 |
| 2007/0039641 | A1 | * | 2/2007 | Hu et al. ........................ 136/238 |
| 2009/0014047 | A1 | * | 1/2009 | Span .............................. 136/204 |
| 2010/0176506 | A1 | | 7/2010 | Hsu et al. |

FOREIGN PATENT DOCUMENTS

| | | | |
|---|---|---|---|
| EP | 1840980 | A1 | 10/2007 |
| JP | 55008023 | A | 1/1980 |
| JP | 2006301711 | A | 11/2006 |
| JP | 2007234913 | A | 9/2007 |
| WO | WO-2010010520 | A2 | 1/2010 |

OTHER PUBLICATIONS

French Search Report for FR 1055978 mailed Mar. 11, 2011 (2 pages).

(Continued)

*Primary Examiner* — Jeffrey T Barton
*Assistant Examiner* — Edward Schmiedel
(74) *Attorney, Agent, or Firm* — Gardere Wynne Sewell LLP (57) ABSTRACT

Electrical energy is generated in a device that includes an integrated circuit which produces thermal flux when operated. A substrate supports the integrated circuit. A structure is formed in the substrate, that structure having a semiconductor p-n junction thermally coupled to the integrated circuit. Responsive to the thermal flux produced by the integrated circuit, the structure generates electrical energy. The generated electrical energy may be stored for use by the integrated circuit.

35 Claims, 5 Drawing Sheets

(56) References Cited

OTHER PUBLICATIONS

English Language Abstract for JP 2007234913A, pub: Sep. 13, 2007.
English Language Abstract for JP 2006301711, pub: Nov. 2, 2006.
English Language Abstract for JP 55008023, pub: Jan. 21, 1980.
Koester, S.J. et al., "Temperature-Dependent Analysis of Ge-on-SOI Photodetectors and Receivers," 2006 IEEE, pp. 179-181.
Roozeboom, F., et al., "System-in-package integration of passives using 3D through-silicon vias," Solid State Technology, May 2008, pp. 38-41 and 47.

* cited by examiner

PROCESS FOR GENERATING ELECTRICAL ENERGY IN A SEMICONDUCTOR DEVICE AND THE CORRESPONDING DEVICE

PRIORITY CLAIM

This application claims priority from French Application for Patent No. 1055978 filed Jul. 22, 2010, the disclosure of which is hereby incorporated by reference.

TECHNICAL FIELD

The invention relates to integrated circuits, and more particularly to the generation of electrical energy in an integrated circuit, other than that produced by a conventional power supply, such as a battery for example.

SUMMARY

According to one method of implementation and embodiment, a process and an integrated circuit are thus provided allowing electrical energy to be recovered from the operation of the integrated circuit itself, so as to optionally store this electrical energy in order to be able for example to supply a specific part of the integrated circuit and/or recharge a battery. It then becomes possible to considerably increase the lifetime of the battery and/or to reduce the size of the latter.

According to one aspect, a process is provided for generating electrical energy in a device comprising an integrated circuit placed in and/or on a substrate. Thus, by way of non-limiting example, the integrated circuit may be fabricated in and/or on the substrate or else be bonded onto the substrate. Said process comprises fabrication of a structure in the substrate, forming a semiconductor p-n junction thermally coupled to the integrated circuit, and generating electrical energy by using said structure which is subjected to a heat flux resulting from operation of the integrated circuit.

The heat flux to which the p-n junction is subjected allows charges to be generated, especially by thermal excitation in the space charge region (depleted region) of the p-n junction. The charge generation coefficient especially depends on the bandgap of the semiconductor used and on the temperature. The charges thus generated will be able to be collected so as for example to be stored.

Thus, it is possible to use the heat given off by an electronic component in operation, generally considered to be undesirable, to produce electrical energy.

According to one method of implementation, said structure is fabricated so that it mainly extends in the direction of the heat flux.

This orientation in the heat-flux direction allows the p-n junction to be subjected to a thermal gradient, thereby favoring drainage of the generated charges. Thus the amount of charge collected is greater.

According to another method of implementation, fabrication of said structure comprises producing, in the substrate, a semiconductor layer extending beneath the integrated circuit, substantially parallel to the integrated circuit, and of opposite conductivity type to that of the substrate, and producing semiconductor trenches which are of the same conductivity type as that of said layer and which make contact with said layer and extend substantially perpendicular to said layer in the direction of the integrated circuit.

The trench structure makes a large junction area possible. The amount of electrical energy generated according to the invention being proportional to the area of the junction, this structure allows more energy to be produced.

According to another method of implementation, fabrication of said structure comprises producing, in the substrate, a well that is more highly doped than the substrate, the trenches being produced in the well and the semiconductor layer being produced in contact with the well.

Said semiconductor layer advantageously has an area substantially equal to that of the integrated circuit.

Thus the entire region irradiated by the thermal energy, i.e. mainly the volume bounded by the parallelepiped located beneath the integrated circuit, may be used to produce trenches.

According to another method of implementation, said structure comprises semiconductors having different bandgaps, for example silicon and germanium and/or a silicon-germanium alloy, or else an alloy the bandgap of which is smaller than that of silicon (for example InSb), allowing infrared radiation emitted by the circuit to be absorbed and thus allowing electron/hole pairs to be generated.

Thus, with a material having a bandgap smaller than silicon for example, more charges are generated within the space charge regions.

According to another additional method of implementation, electrically conductive means are connected to the n-type part and to the p-type part of said structure and the electrical energy generated is stored, for example in a capacitor.

According to another aspect a device is provided, comprising an integrated circuit placed in and/or on a substrate, a structure forming a p-n junction, fabricated in the substrate, and thermally coupled to the integrated circuit, electrically conductive means connected to the n-type part and the p-type part of said structure for transporting the electrical energy generated by said structure when it is subjected to a heat flux resulting from operation of the integrated circuit.

According to one embodiment, said structure extends mainly in the direction of the heat flux.

According to another embodiment, said structure comprises, within the substrate, a semiconductor layer extending beneath the integrated circuit, substantially parallel to the integrated circuit, and of opposite conductivity type to that of the substrate, and semiconductor trenches of the same conductivity type as that of said layer and making contact with said layer and extending substantially perpendicular to said layer in the direction of the integrated circuit.

The structure may comprise, within the substrate, a well that is more highly doped than the substrate and containing said trenches.

According to another embodiment, said semiconductor layer has an area substantially equal to that of the integrated circuit.

According to another embodiment, said structure comprises semiconductors having different bandgaps, or else a bandgap smaller than that of silicon.

According to another embodiment, the device comprises electrically conductive means on the n-type part and on the p-type part of said structure and storage means connected to the electrically conductive means.

BRIEF DESCRIPTION OF THE DRAWINGS

Other advantages and features of the invention will become clearer on examining the detailed description of non-limiting methods of implementation and embodiments and the appended drawings, in which.

DETAILED DESCRIPTION OF THE DRAWINGS

Figure 1:
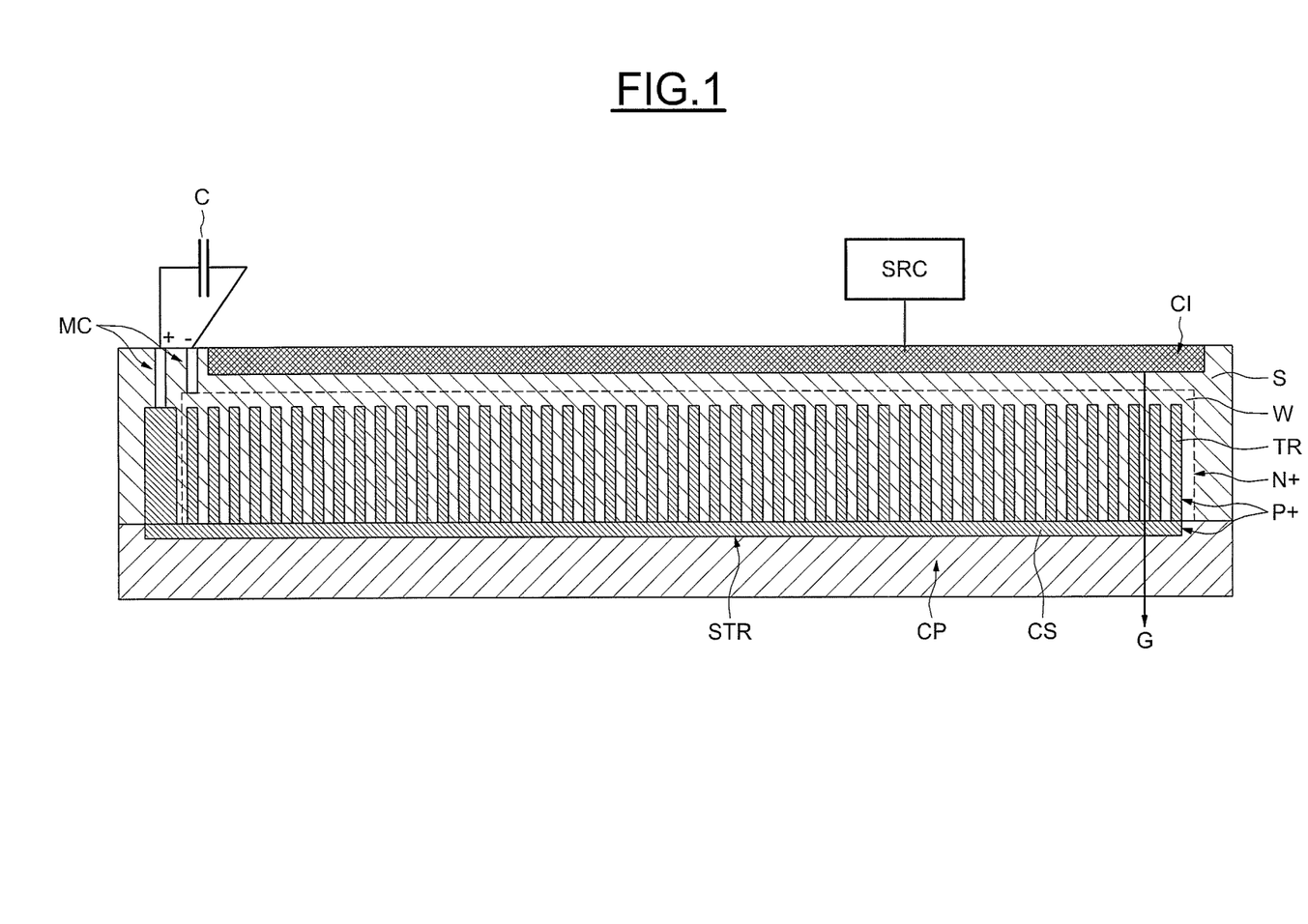
FIGS. 1 to 4 illustrate schematically embodiments of a device according to the invention.

In FIG. 1, the reference CI denotes a conventionally-structured integrated circuit comprising an active part powered by a primary power source SRC and comprising active components, for example transistors. This integrated circuit CI gives off heat when it is operating. The temperature of the integrated circuit may reach approximately one hundred degrees Celsius, even 125° C. at the junctions of the transistors. The substrate S is thermally coupled to the integrated circuit CI. Thus, the heat generated by the integrated circuit dissipates into the substrate as a heat flux, the gradient of which is shown by the arrow G.

Within this substrate S, for example made of silicon, there is a structure STR forming a p-n junction. This structure STR comprises a layer CS containing a $p^+$-type material, for example silicon, surmounted by trenches TR also containing the $p^+$-type material and extending substantially perpendicular to the layer CS and substantially parallel to the gradient G within a well W formed by $n^+$-doped silicon.

Figure 2:
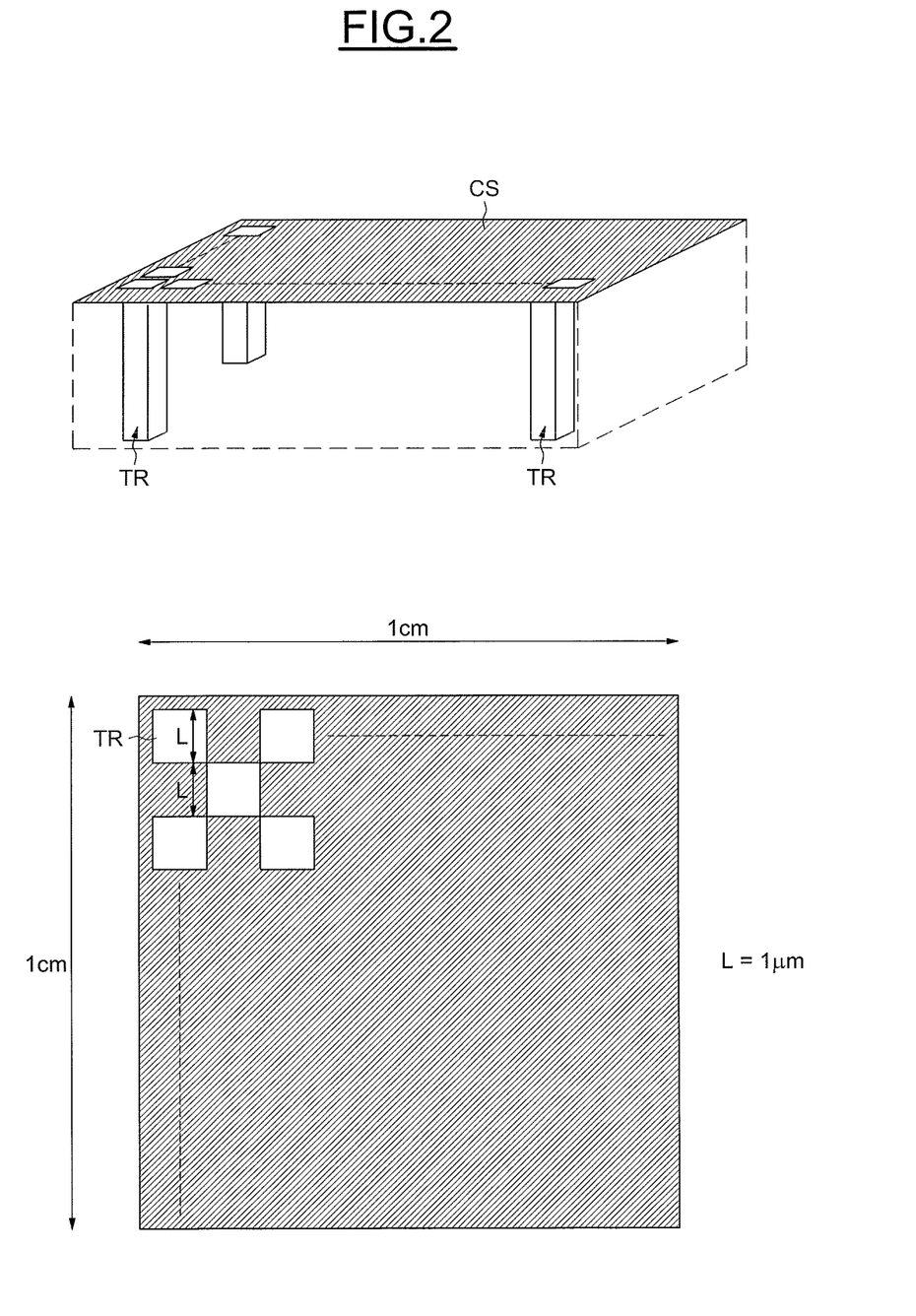

More precisely, as illustrated in FIG. 2, each trench TR here comprises four sides and each of these four sides makes contact with the $n^+$-doped well, thereby producing a trench p-n junction.

In FIG. 2, each trench is shown upside down relative to FIG. 1, with trenches TR for example of 200 μm in height extending in staggered rows over all of the layer CS. By way of exemplary embodiment, in the case of an integrated circuit of 1 cm×1 cm size, each of the bases of the trenches is a square of 1 μm side length. The various trenches are by way of exemplary embodiment spaced 1 μm apart. This structure allows a substantial junction area to be obtained. Thus 1 $cm^2$ contains $2.5 \times 10^7$ trenches of 1 μm side length, corresponding to a junction area equal to $2 \times 10^{10}$ $μm^2$ ($4 \times 200 \times 2.5 \times 10^7$).

Each of these p-n junctions comprises at the interface between the $p^+$-doped material and the $n^+$-doped material a space charge region or depleted region. When the space charge regions are subject to a high temperature, charges are generated therein, for example by thermal excitation. The charges generated are collected by electrically conductive means MC. Storage means, such as a capacitor C, possibly being fabricated in the integrated circuit, allow the electrical energy collected to be stored. Subsequently, the electrical energy collected may be used, for example as a secondary energy source for powering the integrated circuit.

The substrate also comprises, in this example, on the back side, a passivation layer CP, for example made of $SiO_2$. For the p-n junctions, the lower the dopant concentrations in the $p^+$-type and the $n^+$-type materials, the larger the size of the space charge regions, thereby allowing more charges to be generated. But, the lower the dopant concentration, the higher the resistance of the $p^+$-type and $n^+$-type regions, thereby making evacuation of the charges towards the electrically conductive means MC more difficult. A person skilled in the art will know how to choose the $p^+$ and $n^+$ dopant concentrations so as to reach an advantageous compromise between the resistance and the size of the space charge region.

When the well W is made of $n^+$-doped silicon, and the $p^+$-type region is made of $p^+$-doped silicon, with a dopant concentration of $10^{21}$ $at/cm^3$, it is possible with a junction area such as that mentioned above, to obtain for example as much as 86 mA for 1 $cm^2$.

Figure 3:
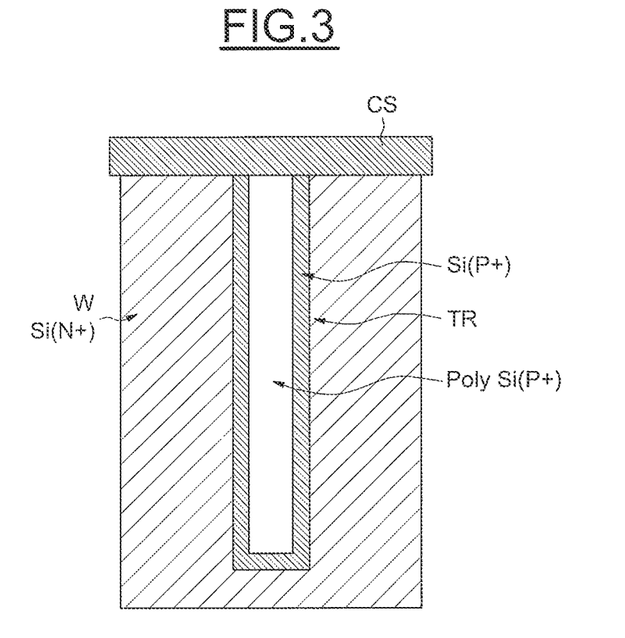

As may be seen in FIG. 3, it is equally possible to use several materials for the $p^+$-type region. By way of exemplary embodiment, epitaxial $p^+$-type silicon doped in situ may be used for the peripheral $p^+$-type region of the trench TR, and for the internal $p^+$-type region, $p^+$-type polysilicon may be used.

Figure 4:
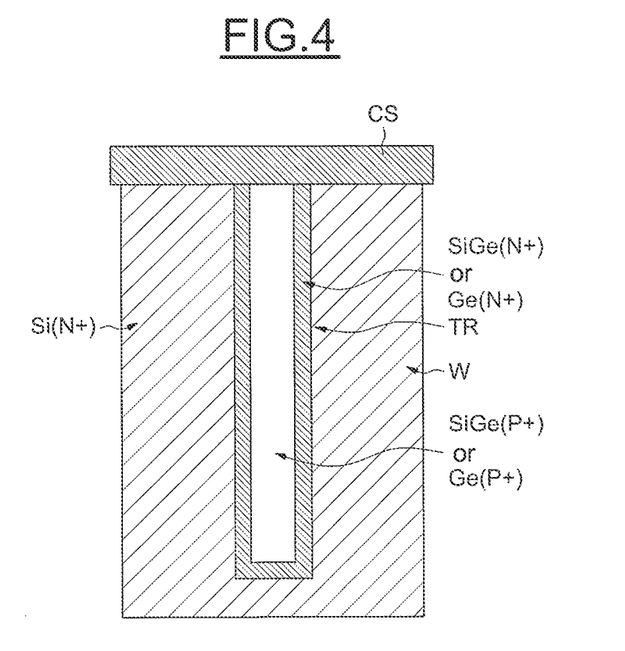
Figures 5, 6:
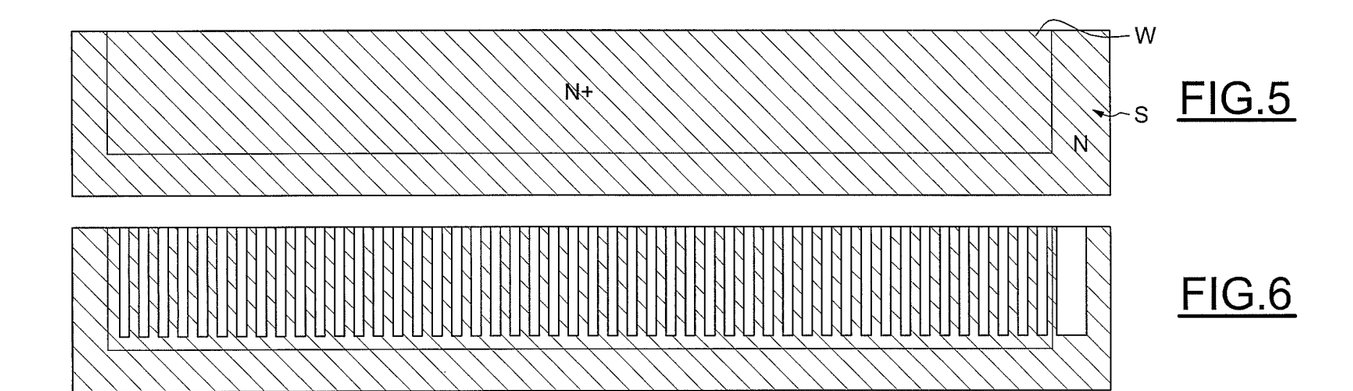
FIGS. 5 to 11 illustrate schematically an exemplary embodiment of a device according to the invention.
Figure 7:
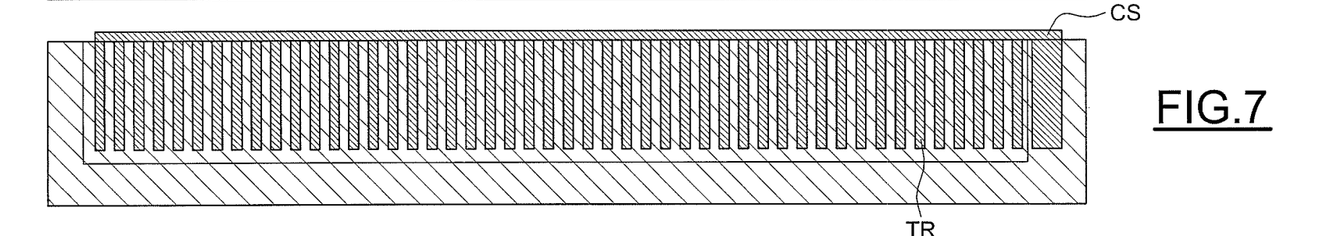
Figure 8:
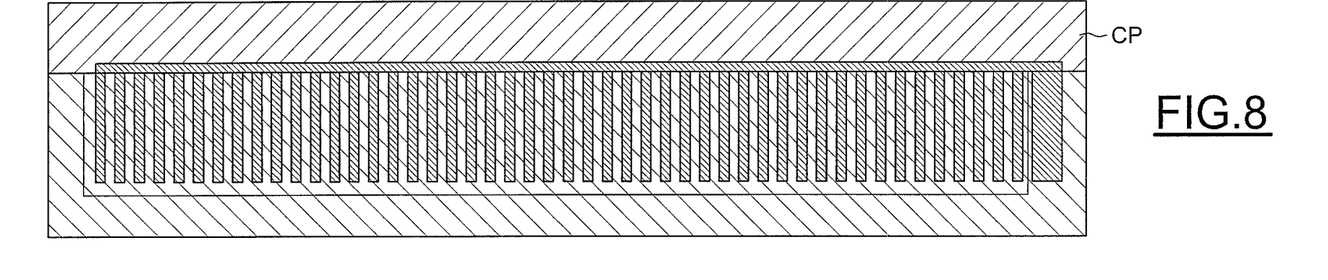
Figure 9:
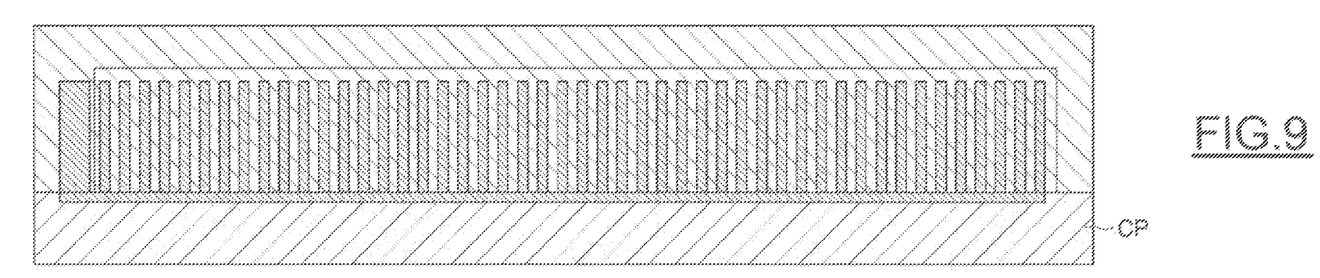
Figure 10:
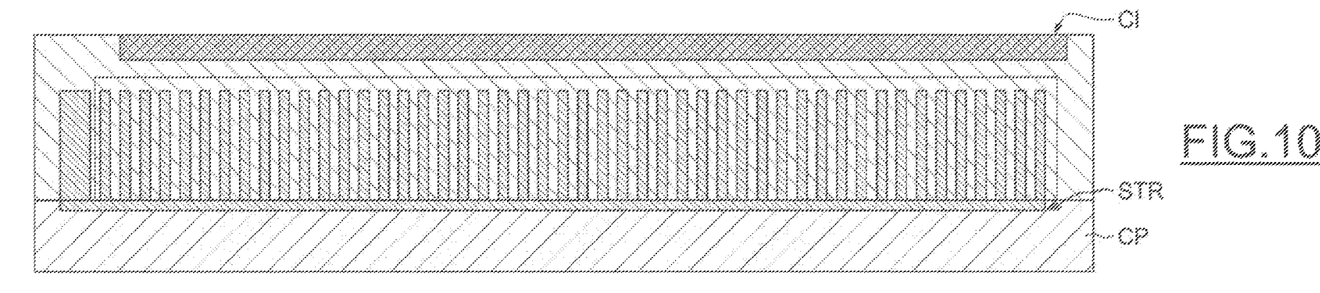
Figure 11:
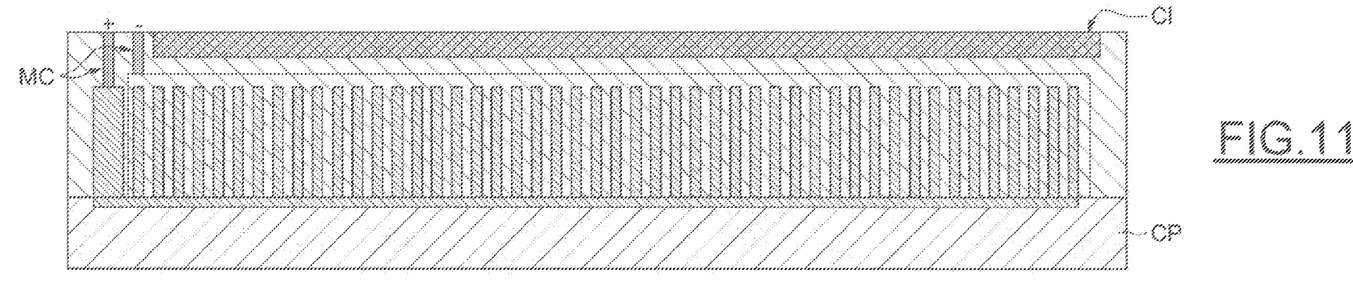

As may be seen in FIG. 4, it is also possible to use materials having different bandgaps for the $p^+$- and $n^+$-type regions. Indeed, this allows more charge carriers to be generated and therefore more charges to be collected. By way of exemplary embodiment, $n^+$-type silicon is used in the $n^+$-type region, $n^+$-type SiGe (epitaxial, doped in situ) or $n^+$-type Ge is used in an $n^+$-type region located directly on the periphery of the $p^+$-type region and $p^+$-type SiGe or $p^+$-type Ge is respectively used in the $p^+$-type region.

A heterojunction of materials having different bandgaps is then obtained. The use of germanium is advantageous because the dark current in germanium is higher than in silicon.

It is also possible to use materials the bandgap of which is smaller than that of silicon (InSb for example) so as to absorb the infrared radiation of the circuit and thus generate charge carriers. FIGS. 5 to 11 show an exemplary process for fabricating the structure for forming the p-n junction according to the invention.

In a first step (FIG. 5), the back side of the silicon S is doped so as to obtain an $n^+$-doped silicon substrate, forming the well W.

In a second step (FIG. 6), trenches are etched in the well W using any technique well known to a person skilled in the art.

In a third step (FIG. 7), the trenches are filled by epitaxial growth of $p^+$-doped silicon. The layer CS is also formed.

In a fourth step (FIG. 8), the wafer is passivated by addition of a passivation layer CP. By way of exemplary embodiment, this layer CP is a layer of $SiO_2$.

In a fifth step (FIG. 9), the wafer is flipped and in a sixth step (FIG. 10) the integrated circuit CI is produced on the front side of the wafer so that the structure STR forming the p-n junction is thermally coupled to the integrated circuit CI.

In a seventh step (FIG. 11), connection means MC are added on the front side of the structure forming the p-n junction thus produced. These means MC are electrically conductive and isolated from the substrate. They may be produced for example using TSVs (through silicon vias).

In the above description, the p-n junction comprises an $n^+$-type region in the substrate and a $p^+$-type region in the trenches, this being so it could have been possible to form a p-n junction using a $p^+$-type substrate and n-type trenches.

What is claimed is:

1. A device, comprising:
    an integrated circuit formed in a semiconductor substrate of a first conductivity type,
    a plurality of trench p-n junctions fabricated inside said semiconductor substrate, each trench p-n junction comprising a trench formed in the semiconductor substrate of the first conductivity type and a filling semiconductor material of a second, opposite, conductivity type filling said trench,
    a layer of semiconductor material of the second conductivity type overlying said semiconductor substrate and in contact with the filling semiconductor material of the second conductivity type for the plurality of trench p-n junctions,
    wherein the plurality of trench p-n junctions are thermally coupled by said semiconductor substrate to the integrated circuit and operable responsive to a heat flux resulting from operation of said integrated circuit to generate electrical energy, and electrically conductive circuitry formed within the semiconductor substrate and electrically connected to said plurality of trench p-n junctions, the electrically conductive circuitry operable to transport the electrical energy generated by said plurality of trench p-n junctions to a load.

2. The device according to claim 1, wherein in a cross-section through said device the plurality of trench p-n junctions comprise a plurality of first fingers of the first conductivity type interdigitated with a plurality of second fingers of the second conductivity type.

3. The device according to claim 1, wherein the semiconductor substrate includes a well of the first conductivity type having a doping concentration greater than a doping concentration of the semiconductor substrate itself, and wherein said plurality of trench p-n junctions are formed in said well.

4. The device according to claim 1, wherein said layer of semiconductor material has an area substantially equal to an area occupied by the integrated circuit.

5. The device according to claim 1, wherein said plurality of trench p-n junctions are trench p n heterojunctions.

6. The device according to claim 1, wherein said load comprises a charge storage device connected to the electrically conductive circuitry.

7. The device according to claim 1 wherein said semiconductor substrate has a top surface within which said integrated circuit is formed and further having a bottom surface, the semiconductor substrate further including a well of the first conductivity type extending into said semiconductor substrate from the bottom surface of the semiconductor substrate and located underneath the integrated circuit; and further comprising:
    said trenches are opened extending into the well at the bottom surface, the trenches being filled with the semiconductor material of the second conductivity type;
    said layer of semiconductor material is located on the bottom surface of the semiconductor substrate, the layer of semiconductor material being in electrical contact with the filling semiconductor material of the second conductivity type; and
    said electrically conductive circuitry extending from the top surface of the semiconductor substrate and making a first contact with the well and making a second contact with the layer of semiconductor material on the bottom surface.

8. The device of claim 7, further comprising a passivation layer covering the layer of semiconductor material on the bottom surface of the semiconductor substrate.

9. The device of claim 6, wherein said charge storage device coupled to the electrical circuitry comprises a capacitive circuit.

10. The device of claim 1, wherein the load comprises a charge storage device operable to store charge generated from the trench p-n junctions in response to heat flux radiated by the integrated circuit.

11. The device of claim 1, wherein the first conductivity type is n-type and the second conductivity type is p-type.

12. The device of claim 11, wherein the semiconductor material of the second conductivity type filling the trenches is p-doped silicon.

13. The device of claim 11, wherein the semiconductor material of the second conductivity type filling the trenches is p-doped polysilicon.

14. The device of claim 11, wherein the semiconductor material of the second conductivity type filling the trenches is p-doped silicon germanium.

15. The device of claim 14, wherein the trenches are lined with an n-doped silicon germanium liner.

16. The device of claim 11, wherein the semiconductor material of the second conductivity type filling the trenches is p-doped germanium.

17. The device of claim 16, wherein the trenches are lined with an n-doped germanium liner.

18. The device of claim 7, wherein the well of the first conductivity type is separated from the integrated circuit by a region of the semiconductor substrate of the first conductivity type.

19. A device, comprising:
    a semiconductor substrate layer of a first conductivity type having a top surface and a bottom surface and including a plurality of first semiconductor finger structures extending from within the semiconductor substrate layer towards the bottom surface;
    a plurality of second semiconductor finger structures of a second, opposite, conductivity type extending from said bottom surface into said semiconductor substrate layer, wherein said plurality of first semiconductor finger structures and said plurality of second semiconductor finger structures are interdigitated;
    a semiconductor layer of the second conductivity type extending over the bottom surface and in electrical contact with said plurality of second semiconductor finger structures;
    an active integrated circuit component formed in the top surface and thermally coupled by said semiconductor substrate layer to said plurality of first semiconductor finger structures;
    wherein the interdigitated first and second semiconductor finger structures and semiconductor substrate layer form a plurality of trench p-n junctions which are operable responsive to a heat flux resulting from operation of said active integrated circuit component to generate an electrical current;
    a first circuit connection formed in said semiconductor substrate layer and in electrical connection with the semiconductor layer; and
    a second circuit connection formed in said semiconductor substrate layer, said electrical current flowing between the first and second circuit connections.

20. The device of claim 19, further comprising a load circuit connected to said first and second circuit connections.

21. The device of claim 20, wherein the load circuit is a capacitive circuit storing charge from said electrical current.

22. The device of claim 19, wherein said semiconductor substrate layer comprises a first semiconductor region of said first conductivity type with a relatively lower doping concentration and a second semiconductor region surrounded by said first semiconductor region of said first conductivity type with a relatively higher doping concentration forming a well region.

23. The device of claim 22, wherein said plurality of first semiconductor finger structures are formed wholly within said well region.

24. The device of claim 23 wherein said semiconductor layer extends beyond an outer boundary of the well region.

25. The device of claim 24 wherein the first circuit connection is formed in the first region to make contact with the semiconductor layer outside the well region.

26. The device of claim 22, wherein the second circuit connection is made within the well region.

27. The device of claim 19, further comprising a passivation layer covering the semiconductor layer and bottom surface of the semiconductor substrate layer.

28. The device of claim 19, wherein the first and second circuit connections extend into the semiconductor substrate layer from the top surface.

29. A device, comprising:
- a semiconductor substrate of a first conductivity type including a front side and a back side, the front side including an integrated circuit device formed therein, the back side including a well region of higher first conductivity type dopant concentration having a depth from the back side which does not reach the integrated circuit device on the front side, said well region including an array of trenches extending into the semiconductor substrate from the back side having a depth from the back side which does not reach the depth of the well;
- a semiconductor material of a second, opposite, conductivity type which fills each of said trenches and forms a layer on said back side of the semiconductor substrate;
- a first electrical connection via extending from said front side into the semiconductor substrate to reach said well;
- a second electrical connection via extending from said front side into the semiconductor substrate to reach said layer of semiconductor material of the second conductivity type on said back side of the semiconductor substrate.

30. The device of claim 29, wherein said array of trenches comprises trenches having a square cross section wherein corners of trenches in the array meet.

31. The device of claim 29, wherein said array of trenches are arranged in staggered rows.

32. The device of claim 29, wherein the trenches are lined with a semiconductor material of the first conductivity type.

33. The device of claim 29 wherein the trenches are lined with a semiconductor material of the second conductivity type.

34. The device of claim 29, wherein the filled trenches, in cross section from the front side to the back side, define a plurality of interdigitated fingers.

35. The device of claim 29, wherein the filled trenches form a plurality of trench p-n junctions which are operable responsive to a heat flux resulting from operation of said integrated circuit device to generate an electrical current flowing from at least one of said first and second electrical connection vias.

* * * * *